(12) United States Patent
Lung

(10) Patent No.: US 7,479,649 B2
(45) Date of Patent: Jan. 20, 2009

(54) VACUUM JACKETED ELECTRODE FOR PHASE CHANGE MEMORY ELEMENT

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 183 days.

(21) Appl. No.: 11/408,596

(22) Filed: Apr. 21, 2006

(65) Prior Publication Data

US 2007/0158862 A1 Jul. 12, 2007

Related U.S. Application Data

(60) Provisional application No. 60/738,883, filed on Nov. 21, 2005.

(51) Int. Cl.
*H01L 47/00* (2006.01)

(52) U.S. Cl. .................. 257/2; 257/4; 257/E45.002

(58) Field of Classification Search ............... 257/2–5, 257/E45.002; 438/95
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Hoppe et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |

(Continued)

FOREIGN PATENT DOCUMENTS

WO  WO 00/45108 A1  8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Thien F Tran
(74) *Attorney, Agent, or Firm*—Haynes Beffel & Wolfeld LLP

(57) ABSTRACT

A memory device having a vacuum jacket around the first electrode element for improved thermal isolation. The memory unit includes a first electrode element; a phase change memory element in contact with the first electrode element; a dielectric fill layer surrounding the phase change memory element and the first electrode element, wherein the dielectric layer is spaced from the first electrode element to define a chamber between the first electrode element and the dielectric fill layer; and wherein the phase change memory layer is sealed to the dielectric fill layer to define a thermal isolation jacket around the first electrode element.

5 Claims, 13 Drawing Sheets

U.S. PATENT DOCUMENTS

| | | | |
|---|---|---|---|
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0051094 A1 | 3/2004 | Ooishi |
| 2004/0248339 A1 | 12/2004 | Lung |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0118913 A1 | 6/2006 | Yi et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |

2007/0176261 A1    8/2007  Lung

FOREIGN PATENT DOCUMENTS

WO      WO 00/79539 A1    12/2000
WO      WO 01/45108 A1     6/2001

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6, no date.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Gibson, G.A. et al., "Phase-change Recording Medium that Enables Ultrahigh-density Electron-beam Data Storage," Applied Physics Letter, 2005, 3 pp., vol. 86.

Happ, T.D. et al., "Novel None-Mask Self-Heating Pillar Phase Change Memory," 2006 Symposium on VLSI Technology, 2 pp.

Hudgens, S. et al., "Overview of Phase-Change Chalcogenide Nonvolatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

VACUUM JACKETED ELECTRODE FOR PHASE CHANGE MEMORY ELEMENT

REFERENCE TO RELATED APPLICATION

This application claims the benefit of U.S. Provisional Patent Application No. 60/738,883 entitled "Vacuum Jacketed Electrode for Phase Change Memory Element" filed on Nov. 21, 2005. That application is incorporated by reference for all purposes.

PARTIES TO A JOINT RESEARCH AGREEMENT

International Business Machines Corporation, a New York corporation; Macronix International Corporation, Ltd., a Taiwan corporation; and Infineon Technologies AG, a German corporation, are parties to a Joint Research Agreement.

BACKGROUND OF THE INVENTION

1. Field of the Invention

The present invention is generally related to the field of non-volatile memory devices, and more particularly to the field of memory devices that employ phase change materials.

2. Description of Related Art

Phase change based memory materials are widely used in read-write optical disks, and such materials are seeing increasing use in computer memory devices. These materials have at least two solid phases, including for example, a generally amorphous solid phase and a generally crystalline solid phase. Laser pulses are used in read-write optical disks to switch between phases and to read the optical properties of the material after the phase change, and electrical pulses are employed in the same manner in computer memory devices.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000, and Reinberg, "Chalcogenide Memory Cell with a Plurality of Chalcogenide Electrodes," U.S. Pat. No. 5,920,788, issued Jul. 6, 1999.

A specific issue arising from conventional phase change memory structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell. That structure, and the attendant fabrication process, is overly complex, yet it does not promote minimal current flow in the memory device.

It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

One aspect of the invention is a memory device having a vacuum jacket around the first electrode element for improved thermal isolation. The memory unit includes a first electrode element; a phase change memory element in contact with the first electrode element; a dielectric fill layer surrounding the phase change memory element and the first electrode element, wherein the dielectric layer is spaced from the first electrode element to define a chamber between the first electrode element and the dielectric fill layer; and wherein the phase change memory layer is sealed to the dielectric fill layer to define a thermal isolation jacket around the first electrode element.

DETAILED DESCRIPTION

Figure 1:
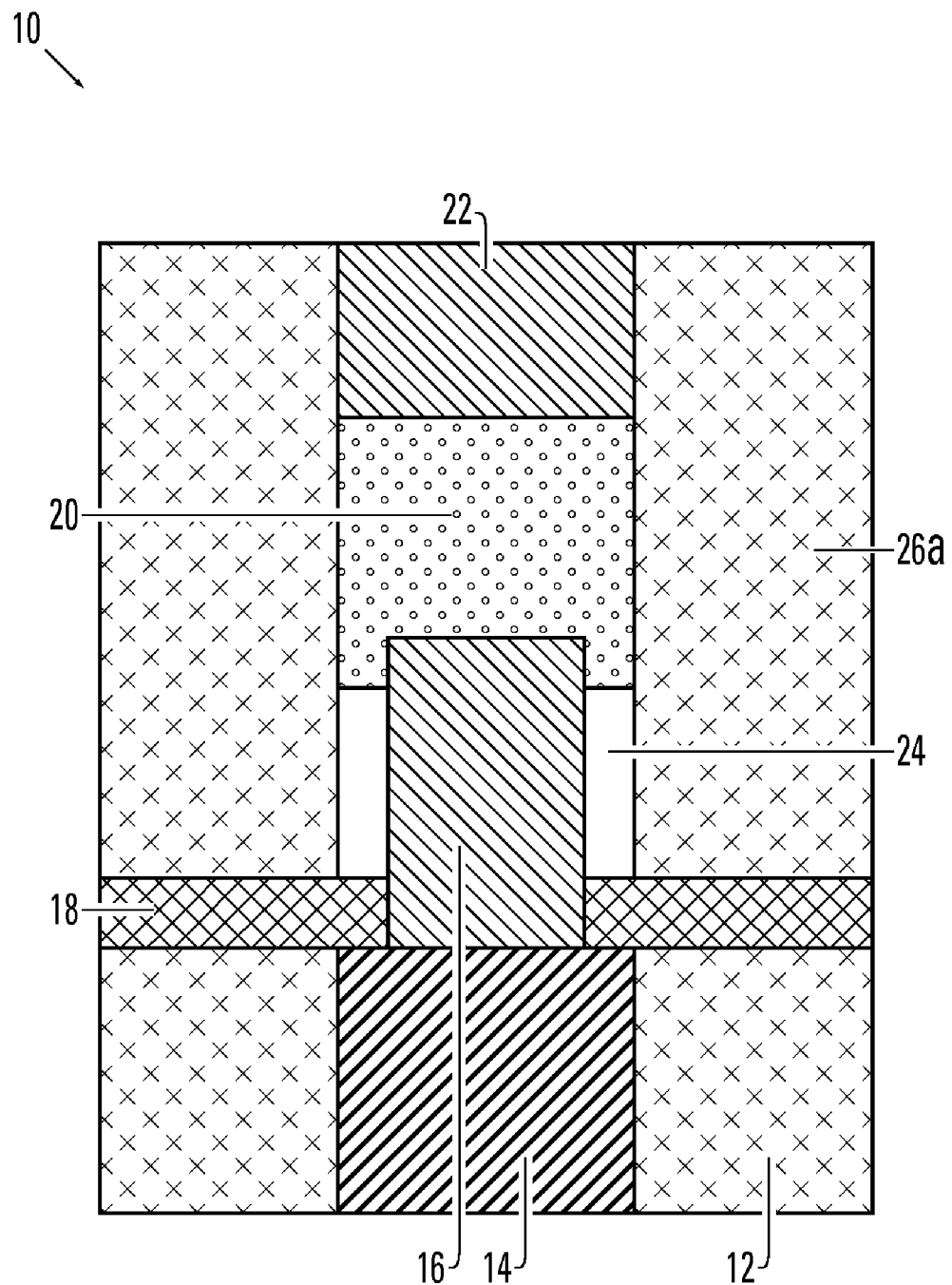
FIG. 1 is a cross-sectional view that illustrates an embodiment of a phase change memory element employing an air cell thermal isolation element.

The following discussion describes embodiments of the invention with particular reference to FIGS. 1-3. It will be understood that the examples and features shown are exemplary and illustrative in nature and not intended to limit the scope of the invention. That scope is defined solely by the claims appended hereto.

The present invention concerns memory elements and memory cells. As used herein, and as is well known in the art, a memory cell is a circuit device designed to hold a charge or state to indicate the logic level of a single data bit. Memory cells are arrayed to provide, for example, the random access memory for a computer. Within certain memory cells, a memory element performs the function of actually holding the charge or state. In a conventional dynamic random access memory cell, for example, a capacitor indicates the logic level of the cell, with a fully charged state indicating a logic 1, or high, state, and fully discharged indicating a logic 0, or low, state.

A memory element 10, an embodiment of the present invention, is illustrated generally in FIG. 1. As seen there, the memory element 10 is shown as a single unit, for purposes of clarity. In practice, each element is a part of a memory cell, which in turn is part of a larger memory array, as discussed more fully below. The structure of a memory element will be discussed first, followed by a description of the process for fabricating the same.

The memory element is formed on a substrate 12, which is preferably a dielectric fill material such as silicon dioxide. Other suitable materials include polyimide, silicon nitride or other dielectric fill materials known in the art. Extending through the substrate to make electrical contact with exterior circuitry (not shown) is a plug element 14, preferably formed from a refractory metal such as tungsten. Other suitable refractory metals include Ti, Mo, Al, Ta, Cu, Pt, Ir, La, Ni, and Ru.

Extending upward from the plug element are a lower electrode element 16, a phase change element 20 and an upper electrode element 22. The upper electrode element is in electrical contact with outside circuitry (not shown).

The phase change element 20 can be formed from a class of materials preferably including chalcogenide based materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide combinations denote chalcogenides amalgamated with other materials such as transition metals. A chalcogenide combination usually contains one or more elements from column six of the periodic table of elements, such as germanium (Ge) and tin (Sn). Often, chalcogenide combinations include one or more of antimony (Sb), gallium (Ga), indium (In), and silver (Ag). Many phase change based memory materials have been described in technical literature, including combinations of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te materials, a wide range of compositions may be workable. The compositions can be characterized as $Te_aGe_bSb_{100-(a+b)}$.

One researcher has described the most useful combinations as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular combinations evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or combinations thereof, may be combined with Ge/Sb/Te to form a phase change material that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These materials are at least bistable. The term amorphous is used to refer to a relatively less ordered structure, more disordered than a single crystal, which has detectable characteristics, such as higher electrical resistivity than the crystalline phase. The term crystalline is used to refer to a structure relatively more ordered than in an amorphous state, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change combination. In the following sections of the disclosure, the phase change material is referred to as GST, and it will be understood that other types of phase change materials can be used. A material useful for implementation of a phase change element described herein is Ge2Sb2Te5.

The upper and lower electrode elements are preferably formed of titanium nitride (TiN) or similar material, such as one or more elements selected from the group consisting of Si, Ti, Al, Ta, N, O, and C. It should be noted that, for purposes of reference only, the direction from the bottom toward the top of the drawings herein is designated "vertical", and the side-to-side direction is "lateral" or "horizontal." Such designations have no effect on the actual physical orientation of a device, either during fabrication or during use.

It is preferred that the thickness (that is, the dimension parallel to the long axis of the printed page herein) of the phase change element 20 be from about 20 nm to about 150 nm, and most preferably about 70 nm. The thickness of the lower electrode 16 should be from about 20 nm to about 150 nm, and most preferably about 100 nm. The width (that is, the dimension parallel to the short axis of the printed page herein) of the lower electrode 16 should be from about 10 nm to about 70 nm, and most preferably about 50 nm. The width of the thermal isolation cell should be from about 2 nm to about 20 nm, and most preferably about 10 nm. Thus, the total width of the phase change element should be from about 50 nm to about 120 nm, and most preferably about 70 nm.

The electrode elements and phase change element are surrounded by an upper insulation layer 26a, preferably formed of the same or similar material as the substrate 12. Between the two insulation layers is a barrier layer 18, formed of SiN or similar material.

The upper insulation layer makes contact with the sides of both the phase change element and the upper electrode, but not with the lower electrode element. The phase change element extends laterally beyond the edges of the lower electrode, so that the ends of the phase change element, the sides of the lower electrode and upper insulation layer and a portion of the barrier layer define a thermal isolation cell 24 surrounding the lower electrode element 16.

In operation, current flows through the memory element from plug assembly 14, to the lower electrode element 16, into the phase change element 20, and out through the upper electrode 22. Of course, the current direction could be altered by changes in element geometry, as will be understood by those in the art. In either event, the phase change material is subject to joule heating as current flows, as discussed above, resulting in a temperature rise in the center of the GST material. When the temperature exceeds the level required for phase change, a portion of the phase change material changes state. Temperature is not uniform throughout the phase change element, with changing values of current density producing significant variations. The temperature of the phase change material determines the effect produced, so the current is chosen to produce a temperature sufficient to create the desired result—either an amorphous state or a crystalline state—in the GST material. If it is desired to read the element status, a low current is employed for sensing purposes. The read operation is non-destructive, as the element temperature is kept below the threshold for a phase change.

The thermal isolation cell 24 functions to contain heat within the phase change element, which has several positive effects. First, by preventing the migration of heat away from the lower electrode element, this design reduces the total heat required to effect phase changes, which in turn reduces the current required for each SET or RESET operation. At the same time, retaining heat within the lower electrode element reduces the heat transferred to the remainder of the memory array, which translates directly into increased lifespan for the device. Given the vast numbers of memory elements within a complete integrated circuit—at least eight billion elements for a 1 GB memory device, for example—it can be appreciated that the effects of such a heat reduction will be significant. Thus, the illustrated design leads to reduced current consumption by the memory element.

Figure 2A:
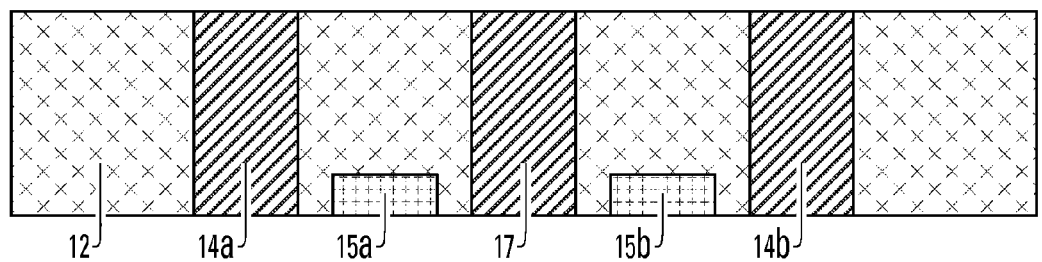
FIGS. 2a-2m illustrate an embodiment of a process for fabricating a phase change memory element as shown in FIG. 1.

An embodiment of a process for fabricating the memory device of the present invention is shown in FIGS. 2a-2m. As known in the art, a memory array is preferably formed employing pairs of memory cells, which structure is shown here. The process begins with a base structure as seen in FIG. 2a, which is suitable for the formation of multiple memory cells, as will be shown below. Plug elements 14a and 14b extend through the substrate material 12, serving separate memory elements. Materials for these two elements are described above. Word lines 15a and 15b extend in a direction perpendicular to the drawing, connecting a number of memory elements in a manner known in the art. It is preferred to form the word lines from polysilicon. Common source line 17 extends through the middle of the pair of memory elements, parallel to the word lines.

Figure 2B:
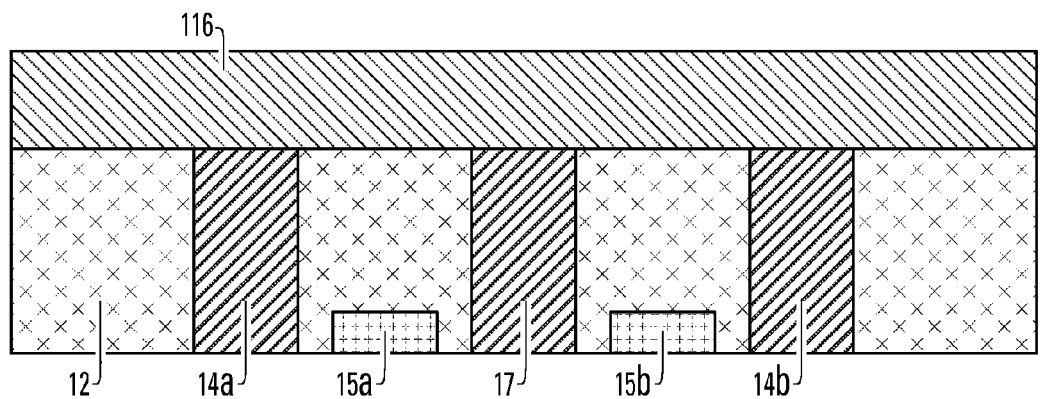
Figure 2C:
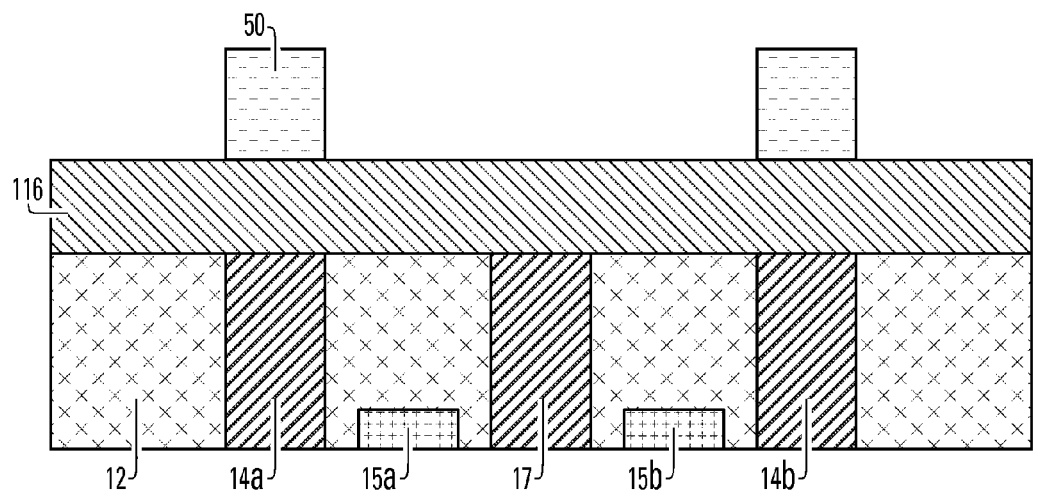
Figure 2D:
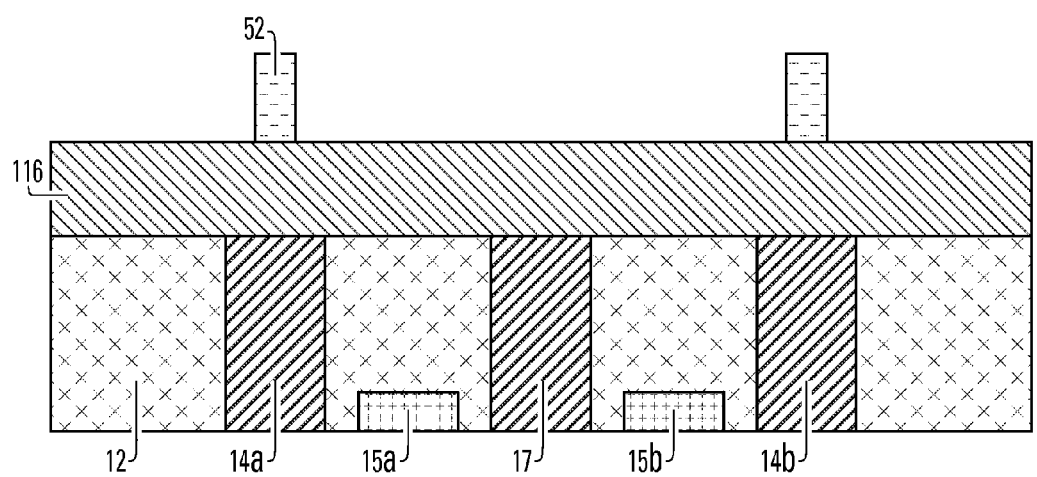

FIG. 2b depicts the addition of electrode material layer 116, whose composition is set out above. In the succeeding two drawings, FIGS. 2c and 2d, the structure is prepared for an etching operation by first depositing and patterning photoresist material 50 in a desired position. Here, however, the conventional lithographic process is not sufficient to achieve the degree of resolution required, in that the width of the lower electrode element (to be formed from the TiN layer 116) is less than the minimum feature size achievable by conventional lithography. Thus, the photoresist is patterned to the smallest possible size in the step shown in FIG. 2c, followed by a trimming step in FIG. 2d to produce the etch masks 52 at the required size. The process for achieving this result is disclosed in pending patent applications owned by the assignee hereof, the details of which are not material to the invention herein.

Figure 2E:
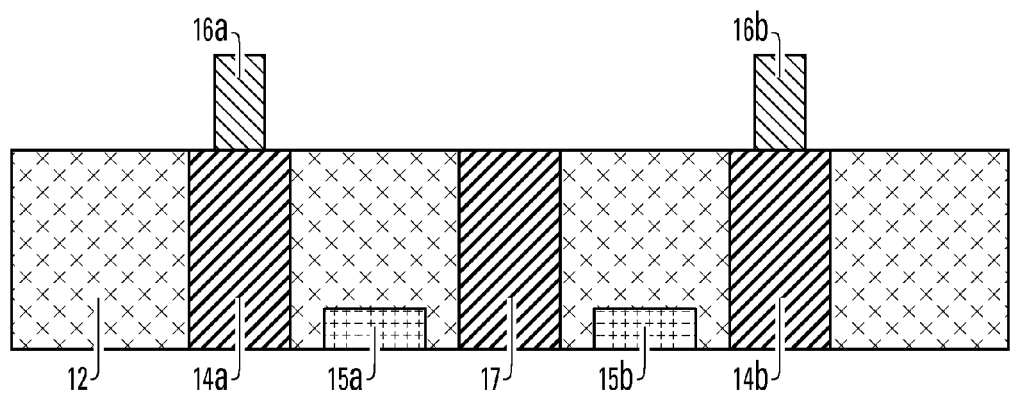
Figure 2F:
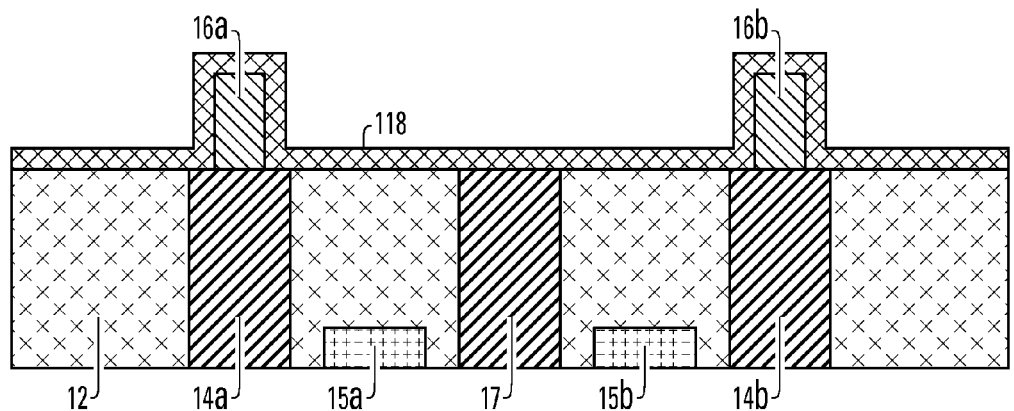

The etching step follows, with results shown in FIG. 2e, in which lower electrode elements 16a and 16b are formed, preferably employing s a dry anisotropic etch using a reactive ion etching (RIE), utilizing a chlorine-based plasma chemistry. An optical emission tool may be used to identify and control the end point of the etch, when the substrate layer is encountered.

Figure 2G:
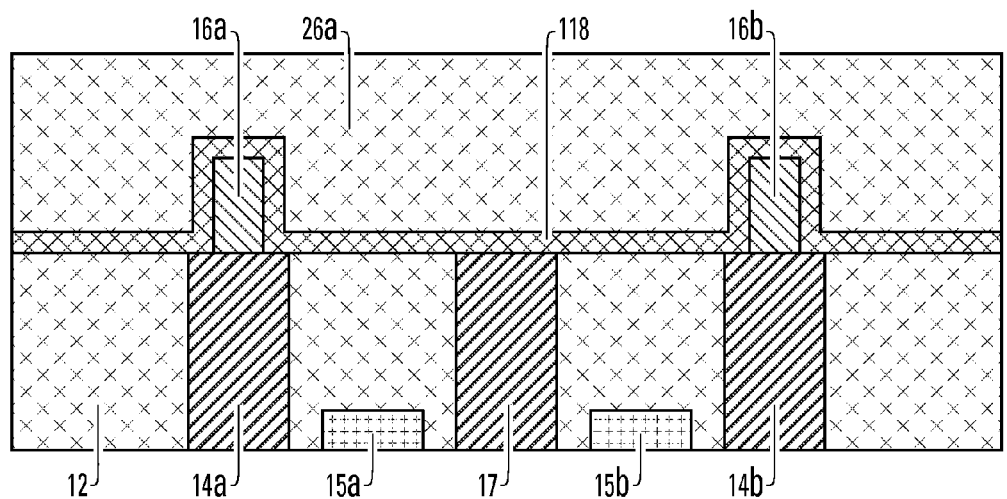
Figure 2H:
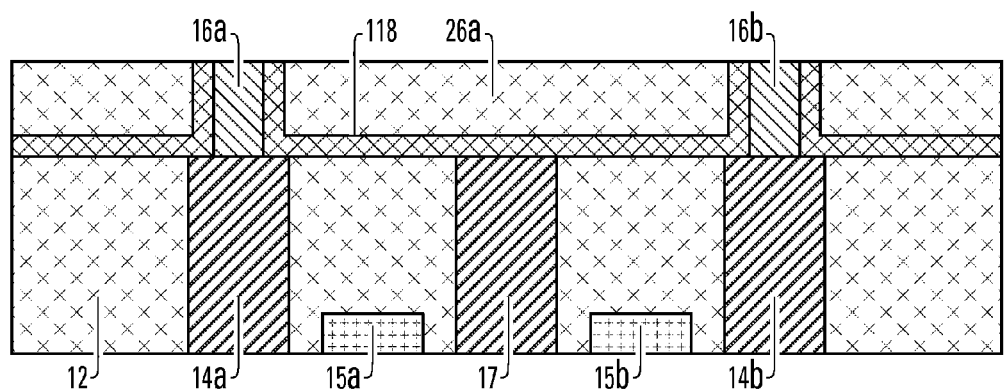

Following the etching, a barrier layer 118 is deposited, composed of SiN, as discussed above, as seen in FIG. 2f. That layer is followed by the deposition of an upper insulation layer 26a, composed of material the same or similar to that of the substrate 12, such as $SiO_2$, as seen in FIG. 2g. That layer is deposited such that it completely covers the lower electrode element and barrier layer. Then, the upper insulation layer is subjected to planarization to expose the upper level of the lower electrode members 16a and 16b, as seen in FIG. 2h.

Figure 2I:
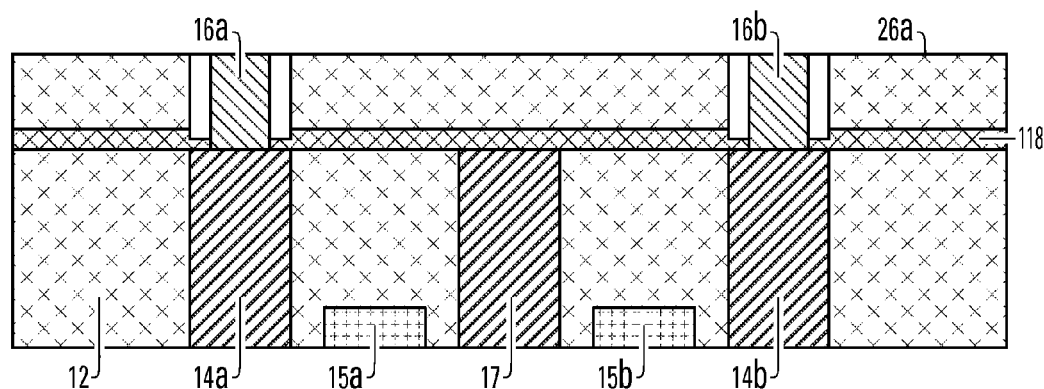

The thermal isolation cells are formed in the next two steps. First, the portions of the barrier layer 118 lying next to the lower electrode elements are etched away, as shown in FIG. 2i. A wet etch, chosen to selectively etch the barrier layer material, is employed for this step. For the preferable material, SiN, a phosphoric acid etch is used. Control is exercised to stop the etching step before an appreciable etching of either the lower electrode or the dielectric material occurs.

Figure 2J:
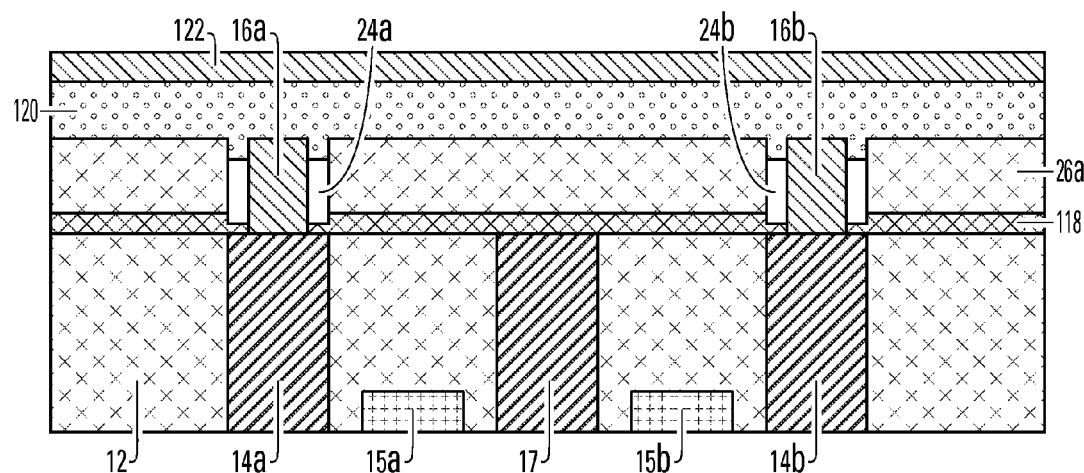

Following the etching step, a two-stage deposition is undertaken to deposit a layer of GST material 120 atop the dielectric material, followed by a layer of electrode material (preferably TiN) 122, as shown in FIG. 2j. This deposition must suffice to form the thermal isolation cells 24a and 24b, by sealing the voids remaining after the previous etching step. The preferred process for this step is sputtering, so that GST material extends into and seals the cell. Process parameters must be chosen such that the sputtering does not altogether fill the cells, as will be understood in the art.

Figure 2K:
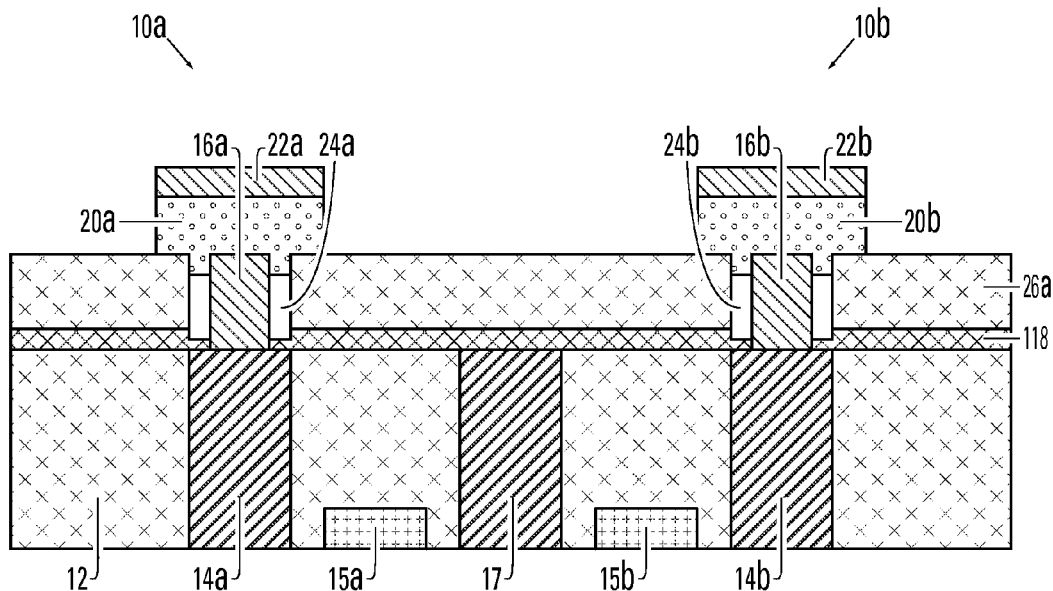

The next step defines the pair of memory elements 10a and 10b. FIG. 2k depicts the results of a patterning and etching step by which the GST and electrode material layers deposited in the previous step are etched to leave phase change elements 20a and 20b as well as upper electrode elements, generally centered on the lower electrodes 16a and 16b. This pattern and etch operation is entirely conventional.

Figure 2L:
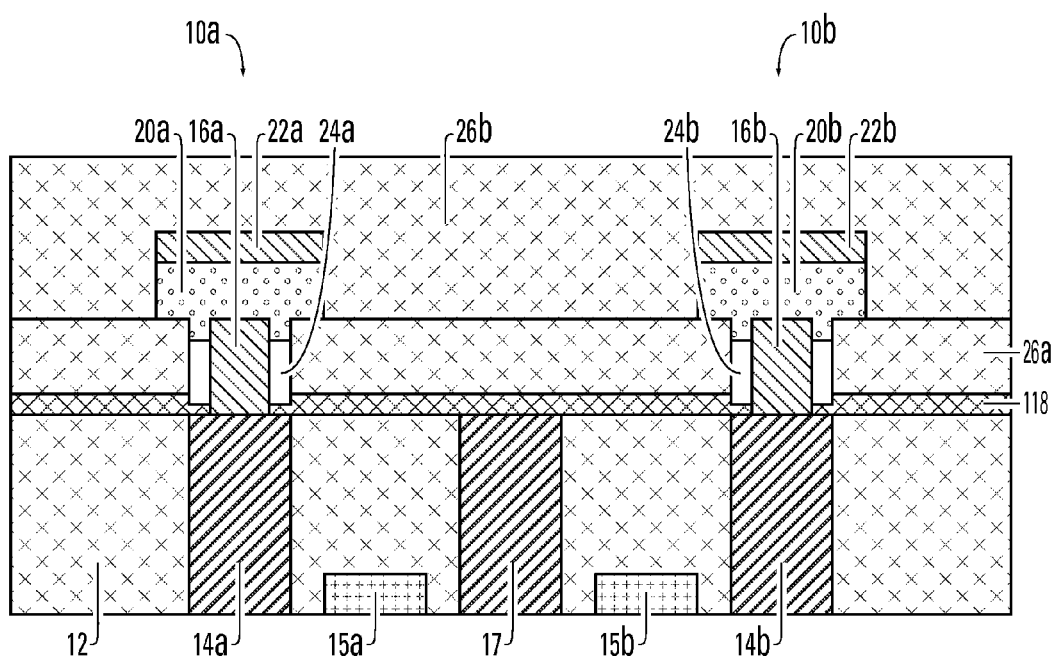
Figure 2M:
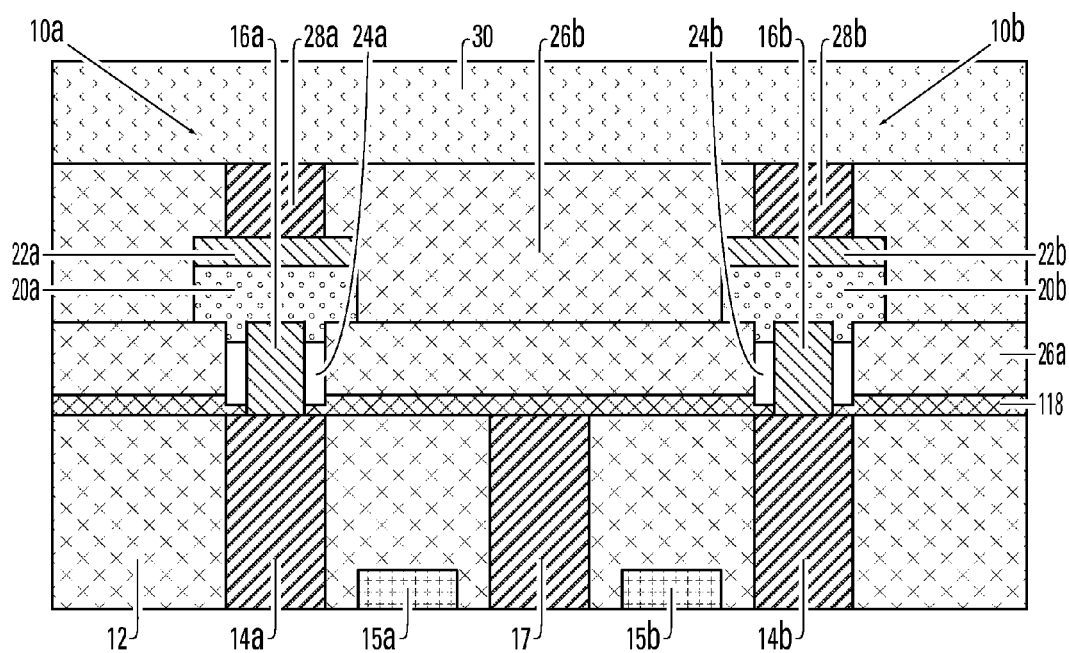

The final two steps complete the fabrication of the memory element. In FIG. 2l, a cap oxide layer 26b is applied to the structure shown in FIG. 2k. The material should be the same as that employed for the insulation layer 26a, and it should be deposited to a depth sufficient to cover the memory elements 10a and 10b completely. In FIG. 2m, the final step, metallization, is illustrated, showing the formation of contact elements 28a and 28b, extending from the upper electrode elements 22a and 22b, and bit line 30 spanning memory elements 10a and 10b and extending in both directions to other memory elements, as is known in the art.

An alternative process is illustrated in FIGS. 3a-3j. Generally, this method follows the "damascene" approach, which generally avoids the conventional method of depositing metals and active materials over wide areas, followed by lithographic patterning and dielectric filling, by first depositing the dielectric fill and then forming and filling the (relatively small) metal and active material areas.

Figure 3A:
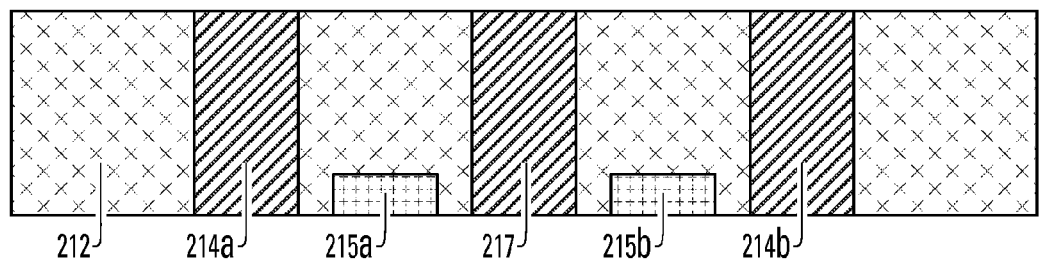
FIGS. 3a-3j illustrate an alternative embodiment of a process for fabricating a phase change memory element as shown in FIG. 1.

The process begins with a base structure as seen in FIG. 3a, which is suitable for the formation of multiple memory cells, as will be shown below. Plug elements 214a and 214b extend through the substrate material 212, serving separate memory elements. Materials for these two elements are described above. Word lines 215a and 215b extend in a direction perpendicular to the drawing, connecting a number of memory elements in a manner known in the art. It is preferred to form the word lines from polysilicon. Common source line 217 extends through the middle of the pair of memory elements, parallel to the word lines.

Figure 3B:
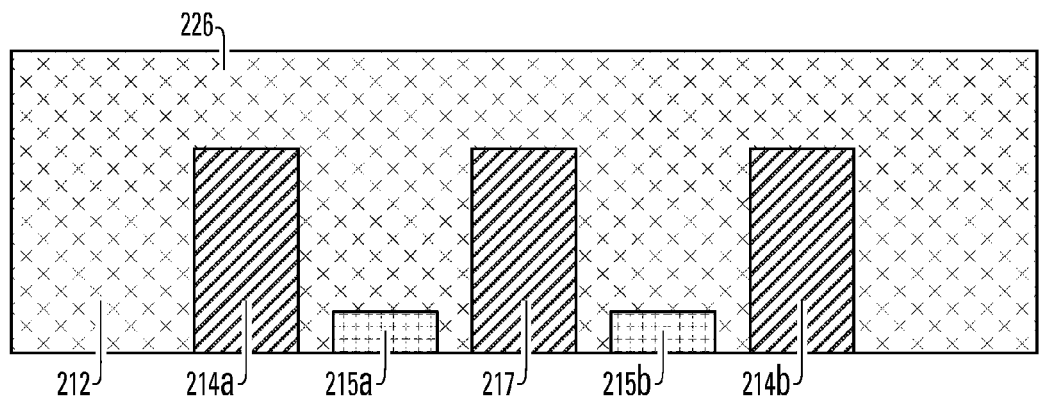
Figure 3C:
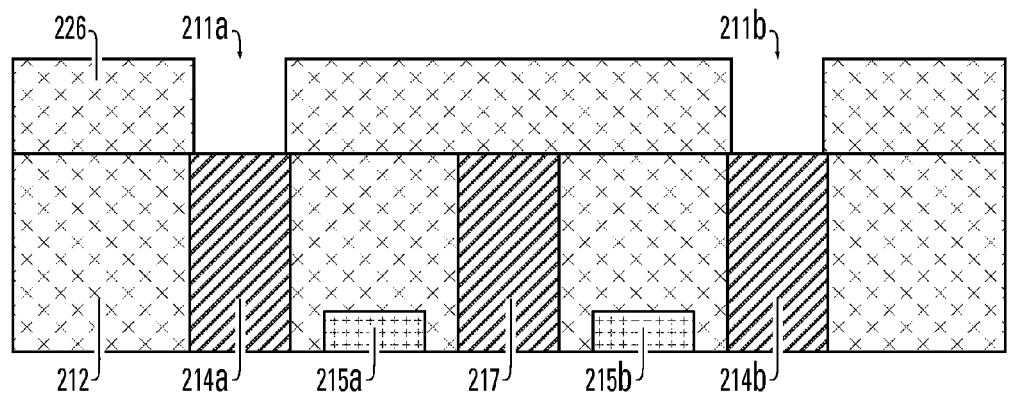
Figure 3D:
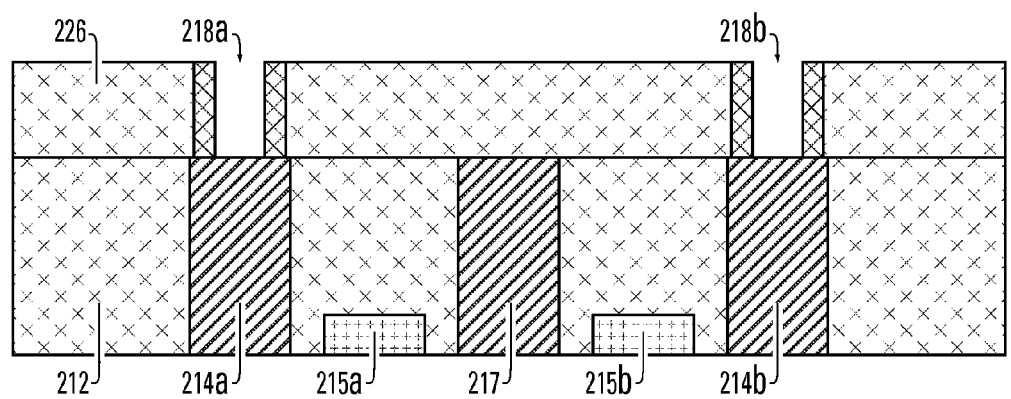
Figure 3E:
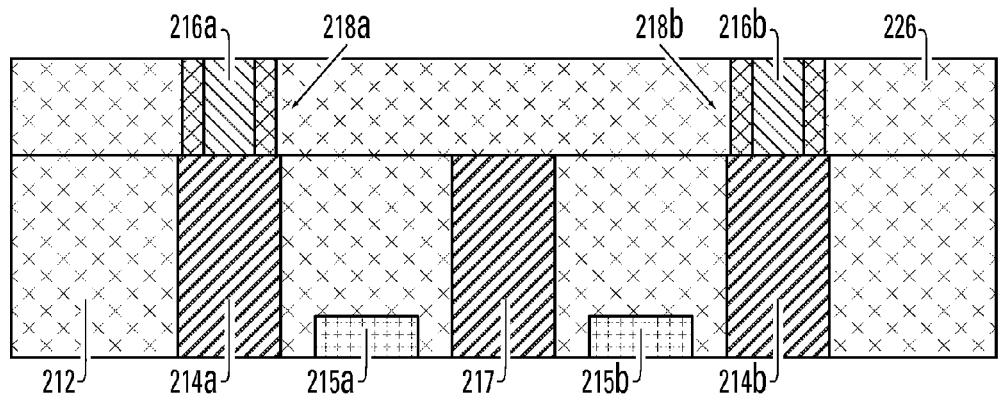
Figure 3F:
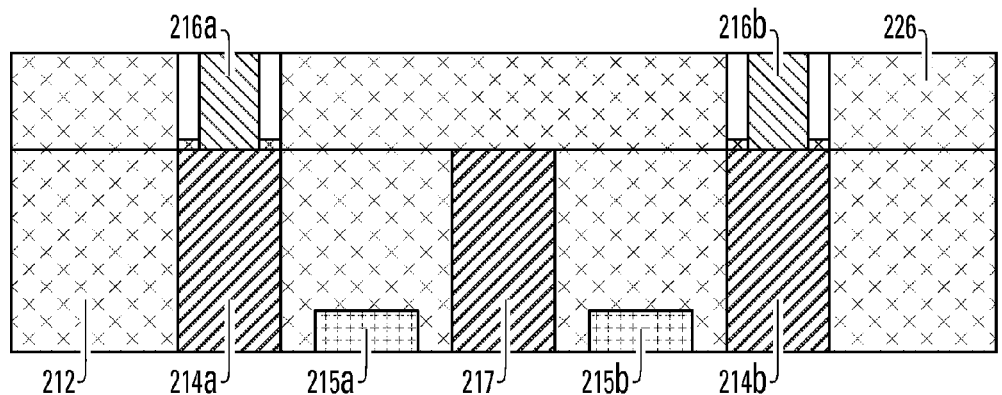

FIG. 3b depicts the addition of upper dielectric layer 226, preferably of the same material employed for the substrate. In the succeeding four drawings, FIGS. 3c-3f, the lower portions of each memory element are formed. First, the upper dielectric layer is patterned and etched to open two cavities 211a and 211b, positioned atop the plugs 214a and 214b. The etching step, which could be performed by RIE, should be controlled so that the upper surfaces of the plug elements are exposed. The lithographic operation that produces these cavities is known in the art. Next, as shown in FIG. 3d, side walls 218a and 218b are formed in each cavity. The side walls are preferably composed of SiN or similar material. Preferably, the material is deposited employing chemical vapor deposition (CVD) or a similar process, followed by RIE to form the sidewalls. A deposition step follows, shown by FIG. 3e, in which lower electrode elements 216a and 216b are formed, preferably employing CVD or other known deposition technique. These elements are preferably composed of TiN or similar material, as discussed above. Finally, side walls 218a and 218b are etched away, as shown in FIG. 3f. A wet etch, chosen to selectively etch the side wall layer material, is employed for this step. For the preferable material, SiN, a phosphoric acid etch is used. Control is exercised to stop the etching step before an appreciable etching of either the lower electrode or the dielectric material occurs.

Figure 3G:
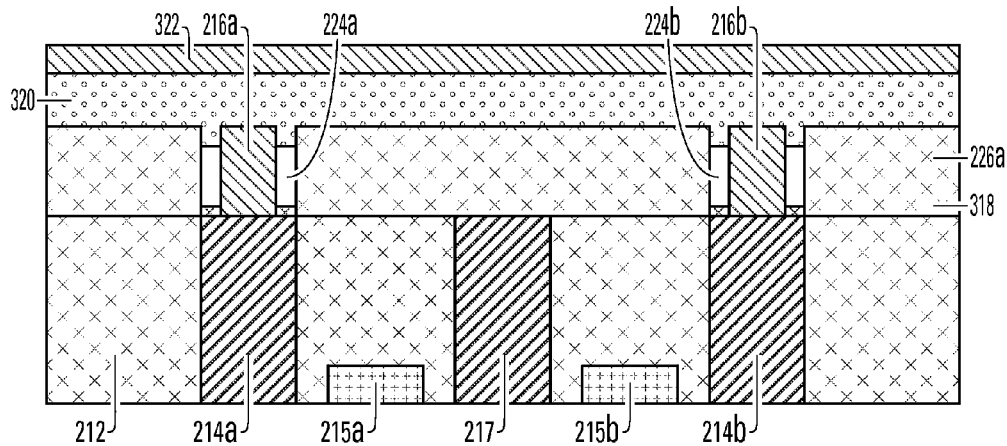

The thermal isolation cells and the upper portions of the memory elements are formed in the next two steps. A two-stage deposition, illustrated in FIG. 3g, is undertaken to deposit a layer of GST material 320 atop the dielectric material 226a, followed by a layer of electrode material (preferably TiN) 322. This deposition must suffice to form the thermal isolation cells 224a and 224b, by sealing the voids remaining after the previous etching step. The preferred process for this step is sputtering, so that GST material extends into and seals the cell, as shown. Process parameters must be chosen such that the sputtering does not altogether fill the cells, as will be understood in the art.

Figure 3H:
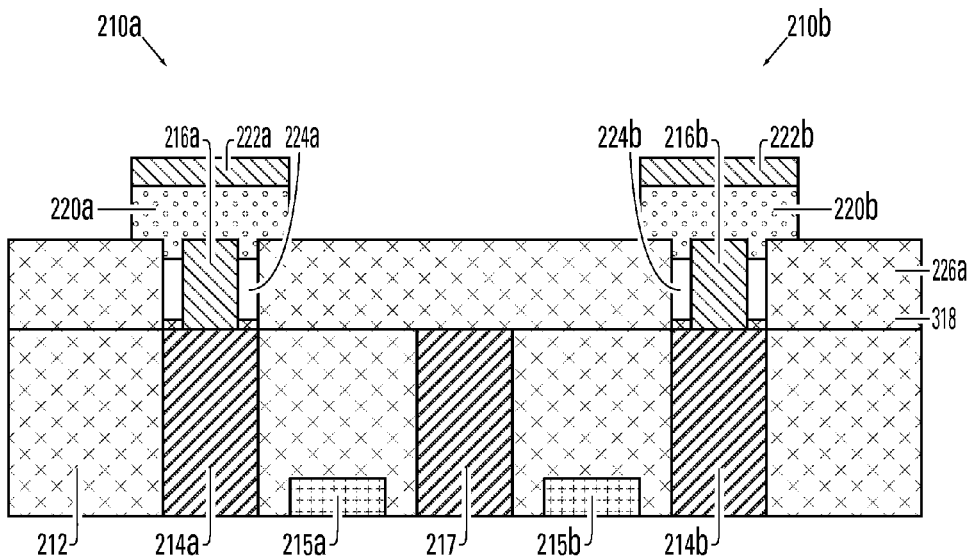

The next step defines the pair of memory elements 210a and 210b. FIG. 3h depicts the results of a patterning and etching step by which the GST and electrode material layers deposited in the previous step are etched to leave phase change elements 220a and 220b as well as upper electrode elements 222a and 222b, generally centered on the lower electrodes 216a and 216b. This pattern and etch operation is entirely conventional.

Figure 3I:
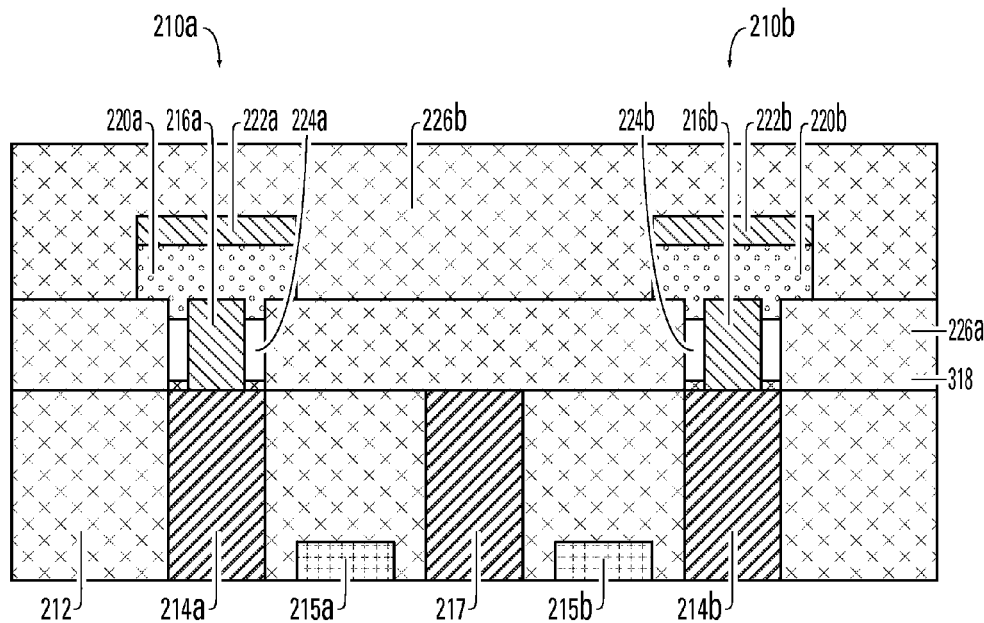
Figure 3J:
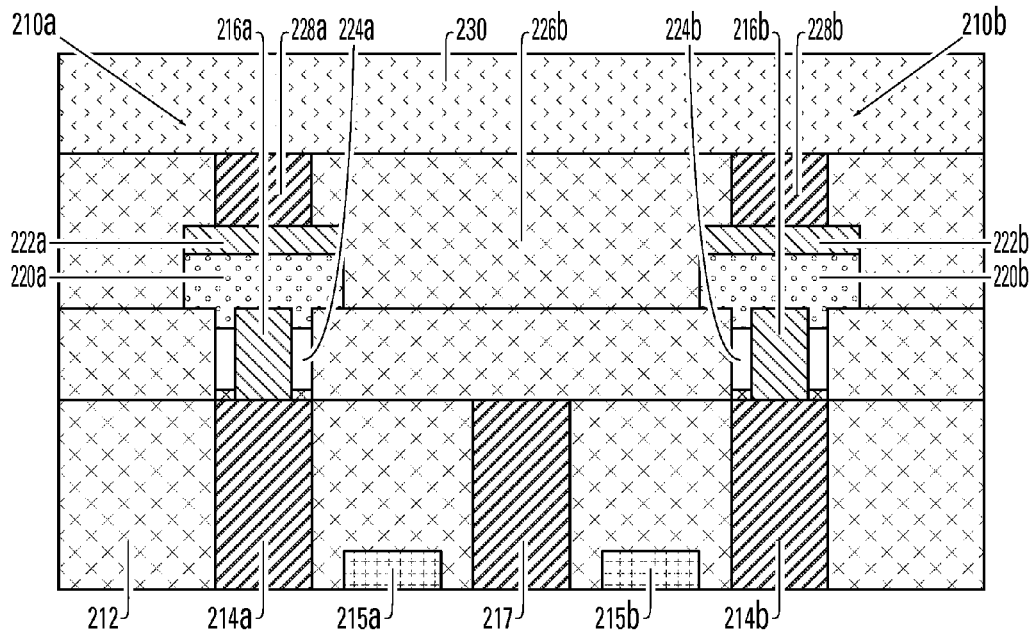

The final two steps complete the fabrication of the memory elements. In FIG. 3i, a cap oxide layer 226b is applied to the structure shown in FIG. 3h. The material should be the same as that employed for the insulation layer 226a, and it should be deposited to a depth sufficient to cover the memory elements 210a and 210b completely. In FIG. 3j, the final step, metallization, is illustrated, showing the formation of contact elements 228a and 228b, extending from the upper electrode elements 222a and 222b, and bit line 230 spanning memory elements 210a and 210b and extending in both directions to other memory elements, as is known in the art.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a first electrode element;
   a dielectric fill layer surrounding the first electrode element, wherein the dielectric fill layer is spaced from the first electrode element to define a chamber between the first electrode element and the dielectric fill layer; and
   a phase change memory element which is in contact with the first electrode element and the dielectric fill layer and extends across and seals the chamber to define a thermal isolation jacket around the first electrode element.

2. The device of claim 1, wherein the phase change memory element includes memory material that comprises a combination of Ge, Sb, and Te.

3. The memory device of claim 1, wherein the phase change memory element includes memory material that comprises a combination of two or more materials from the group of Ge, Sb, Te, Se, In, Ti, Ga, Bi, Sn, Cu, Pd, Pb, Ag, S, and Au.

4. The memory device of claim 1, wherein the first electrode element has a top surface in contact with the phase change memory element, the dielectric fill layer has a top surface and the phase change memory element lies on the top surface of the first electrode element and the top surface of the dielectric fill layer across the chamber.

5. The memory device of claim 4, wherein the dielectric fill layer has a top surface that is co-planar with the top surface of the first electrode element.

* * * * *